US006957964B2

(12) United States Patent
Chiang

(10) Patent No.: US 6,957,964 B2
(45) Date of Patent: Oct. 25, 2005

(54) CONDUCTIVE TERMINAL AND ELECTRICAL CONNECTOR APPLYING THE CONDUCTIVE TERMINAL

(75) Inventor: Chun-Hsiang Chiang, Taipei Hsien (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/862,550

(22) Filed: Jun. 7, 2004

(65) Prior Publication Data

US 2004/0259394 A1 Dec. 23, 2004

(30) Foreign Application Priority Data

Jun. 5, 2003 (TW) .............................. 92210304 U
Jun. 5, 2003 (TW) .............................. 92210305 U
Jun. 5, 2003 (TW) .............................. 92210306 U

(51) Int. Cl.[7] .......................... H01R 12/00; H01R 4/48
(52) U.S. Cl. .......................................... 439/66; 439/862
(58) Field of Search .............................. 439/66, 68, 71, 439/74, 591, 342, 525, 862

(56) References Cited

U.S. PATENT DOCUMENTS 5,139,427 A * 8/1992 Boyd et al. ................... 439/66
6,146,151 A * 11/2000 Li ............................... 439/66
6,196,852 B1 * 3/2001 Neumann et al. ............. 439/66
6,200,141 B1 * 3/2001 Sinclair ....................... 439/66
6,688,893 B1 * 2/2004 Huang et al. ................. 439/66
2004/0253845 A1 * 12/2004 Brown et al. ................. 439/66

* cited by examiner

*Primary Examiner*—Michael C. Zarroli
(74) *Attorney, Agent, or Firm*—Robert J. Zeitler

(57) ABSTRACT

A conductive terminal is positioned in an insulative housing to constitute an electrical connector. The insulative housing is formed with a first face and a second face opposite to each other, and has a plurality of terminal receiving cavities extending through the first face and the second face. The conductive terminal includes a base for abutting against the corresponding terminal receiving cavity to achieve positioning. The base has two spaced-apart opposite sidewalls. Each sidewall is formed with a first edge and a second edge opposite to each other in a direction of extension of the terminal receiving cavity. A plurality of resilient arms extend outwardly from certain of the edges of the sidewalls such that the first and second contact portions of the resilient arms are respectively and electrically connected to an electronic component and a circuit board to transmit signals between the electronic component and the circuit board through the conductive terminal.

20 Claims, 4 Drawing Sheets

1 11 2 20 21 21a 21b 22 22a 22b 23 23a 23b 24 25 45 451 452 46 461 462 13 13a 12

CONDUCTIVE TERMINAL AND ELECTRICAL CONNECTOR APPLYING THE CONDUCTIVE TERMINAL

FIELD OF THE INVENTION

This invention relates to a conductive terminal and an electrical connector using such conductive terminals, and, more particularly, to a conductive terminal applied to an LGA (land grid array) electrical connector.

BACKGROUND OF THE INVENTION

Referring to FIG. 1, U.S. Pat. No. 5,653,598 discloses an LGA (land grid array) electrical connector and a conductive terminal employed thereby, in which a tightening member (not shown) is generally used to clamp the electrical connector between a packaged integrated circuit (IC) 8 and a circuit board 9 so as to establish electrical connection without the need for a soldering step.

A bottom side of the integrated circuit 8 is formed with conductive contact pads 81 that are arranged in an array, and the circuit board 9 also has conductive contact pads 91 provided thereon at positions corresponding to the contact pads 81 of the integrated circuit 8. The integrated circuit 8 and the circuit board 9 are respectively located on two opposite upper and lower sides of the electrical connector. In addition, a plurality of terminal receiving cavities 61 are provided in an insulative housing 6 of the electrical connector and are arranged in an array form.

Each terminal receiving cavity 61 is disposed to receive a conductive terminal 7. The conductive terminal 7 includes two spaced-apart resilient arms 71, 72 and a bent portion 73 connected to one end of each of the resilient arms 71, 72 and having a measure of resiliency. Each of the resilient arms 71, 72 has a free end. A nose 711, 721 is formed at the free end to contact the contact pad 81, 91 of the integrated circuit 8 or the circuit board 9. A support arm 712, 722 extends from one nose 711 or 721 toward the other nose 721 or 711. When the integrated circuit 8 and the circuit board 9 are forced to approach the electrical connector, the conductive terminal 7 will be pressed so that the two resilient arms 71, 72 displace toward each other such that the support arms 712, 722 contact each other, thereby establishing a signal transmission path.

However, there are drawbacks with the aforesaid electrical connector. For instance, when the bent portion 73 of the conductive terminal 7 deforms, lateral deformation may also occur at the same time such that the two support arms 712, 722 move toward each other without contacting. Even though the wall surface of the terminal receiving cavity 61 can limit lateral displacement of the support arms 712, 722, the support arms 712, 722 may just scrape the wall surface of the terminal receiving cavity 61, without coming into contact with each other. Therefore, the aforesaid structure is quite unsatisfactory in terms of signal transmission stability.

Hence, the inventor has proposed another solution with respect to such an LGA electrical connector construction.

SUMMARY OF THE INVENTION

Therefore, an object of this invention is to provide a conductive terminal applied to an LGA and having preferred electrical connection stability, and an electrical connector structure.

Another object of this invention is to provide a conductive terminal and an electrical connector having a dual conducting path and capable of effectively reducing inductance value so as to enhance signal transmission reliability.

Accordingly, the conductive terminal of this invention is positioned in an insulative housing to constitute an electrical connector. The insulative housing is formed with a first face and a second face opposite to each other, and has a plurality of receiving cavities extending through the first face and the second face.

The conductive terminal includes a base for abutting against the corresponding receiving cavity to achieve positioning. The base has two spaced apart opposite sidewalls. Each of the sidewalls has a first edge and a second edge opposite to each other in a direction of extension of the receiving cavity. A first resilient arm extends outwardly from the second edge of one of the sidewalls. A second resilient arm extends outwardly from the first edge of the other one of the sidewalls. A free end of the second resilient arm forms a first contact portion which projects outwardly of the first face of the insulative housing. A free end of the first resilient arm forms a second contact portion which projects outwardly of the second face of the insulative housing. The first and second contact portions electrically and respectively contact an electronic component and a circuit board to permit signal transmission.

Alternatively, the conductive terminal includes a base for abutting against the corresponding receiving cavity to achieve positioning. The base has two spaced-apart opposite sidewalls. Each sidewall is formed with a first edge and a second edge opposite to each other and in a direction of extension of the terminal receiving cavity. A first resilient arm and a second resilient arm extend outwardly and respectively from the first edge and the second edge of one of the sidewalls. A third resilient arm and a fourth resilient arm extend respectively from the first edge and the second edge of the other one of the sidewalls. Free ends of the first resilient arm and the third resilient arms cooperatively form a first contact portion, whereas free ends of the second resilient arm and the fourth resilient arm cooperatively form a second contact portion. By having the first contact portion and the second contact portion to electrically contact the electronic component and the circuit board, respectively, the electronic component can be electrically connected to the circuit board in a dual conducting path via the conductive terminal.

The conductive terminal may also include a base for abutting against the corresponding terminal receiving cavity to achieve positioning. The base has two adjacent sidewalls forming an angle therebetween. Each of the sidewalls has a first edge and a second edge opposite to each other in a direction of extension of the terminal receiving cavity. A first resilient arm and a second resilient arm extend respectively from the first and second edges of one of the sidewalls such that the first resilient arm forms a first contact portion and the second resilient arm forms a second contact portion.

The first contact portion projects outwardly of a plane in which the first face of the insulative housing lies, whereas the second contact portion projects outwardly of a plane in which the second face of the insulative housing lies. The first and second contact portions electrically and respectively contact an electronic component and a circuit board to permit signal transmission.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

Figure 1:
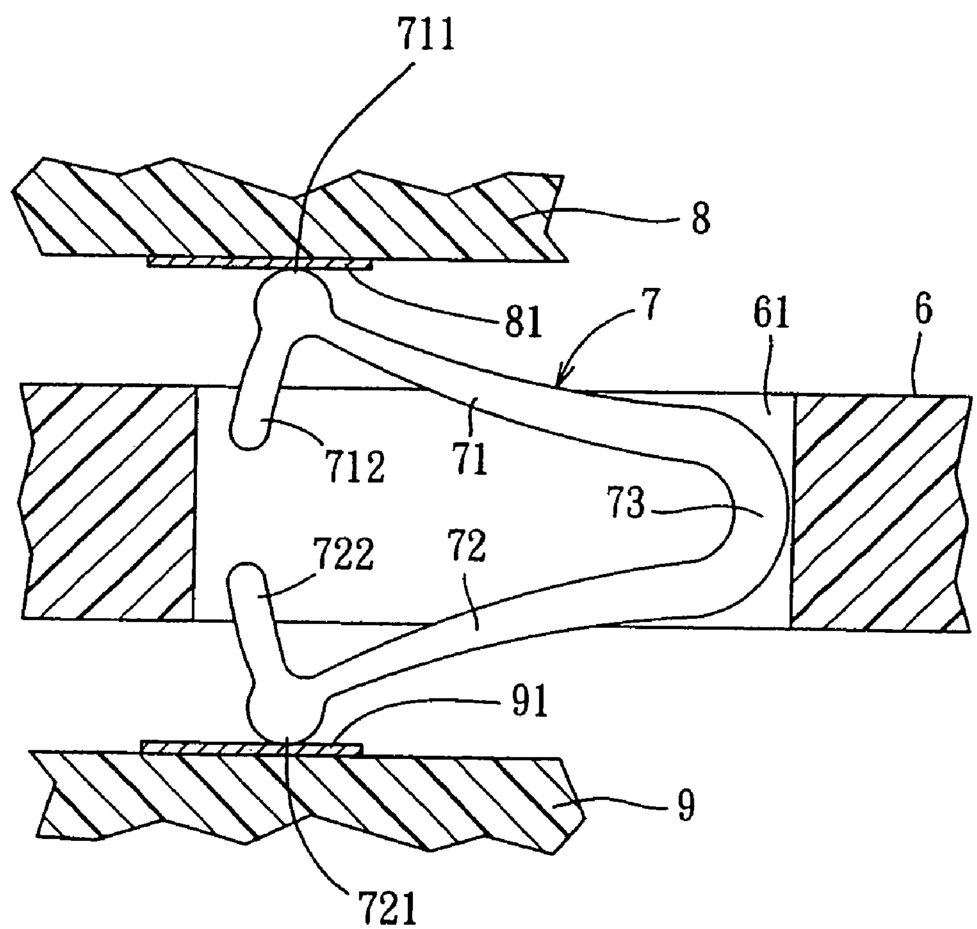
FIG. 1 is a schematic view to illustrate the structure of a conventional conductive terminal applied to an LGA electrical connector.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
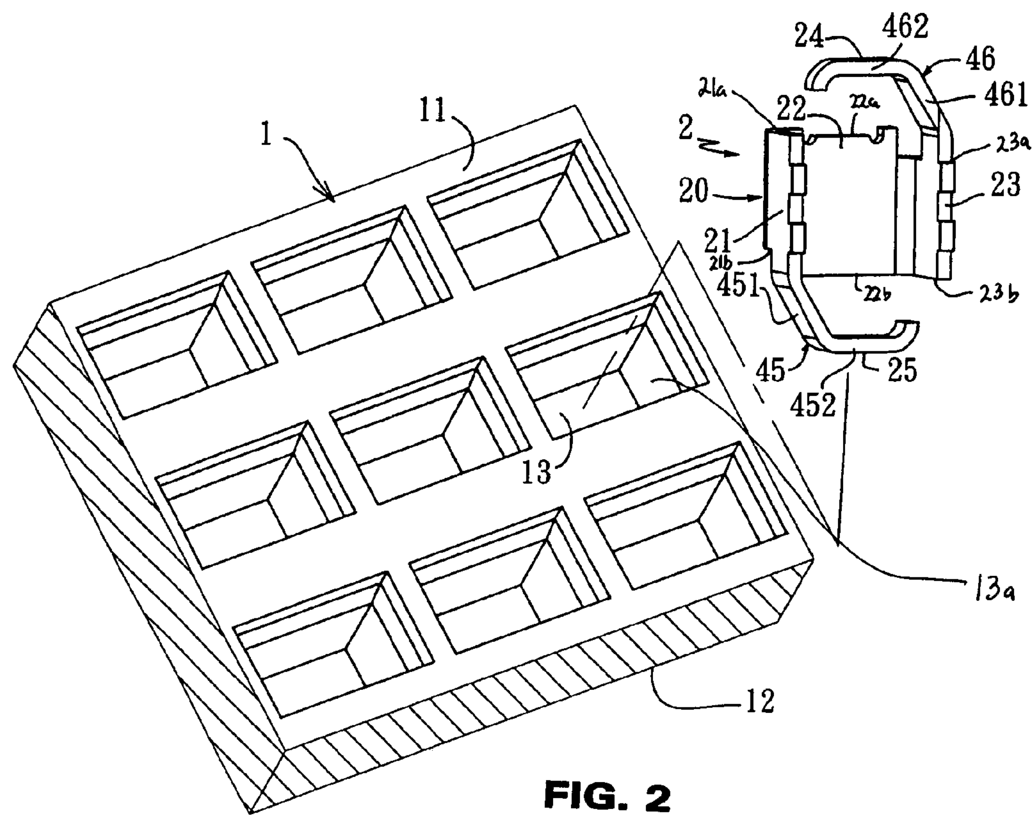
FIG. 2 is a perspective view of the structure of an embodiment of a conductive terminal according to this invention, illustrating schematically the configuration of an electrical connector formed by an assembly of the conductive terminal and an insulative housing.
Figure 3:
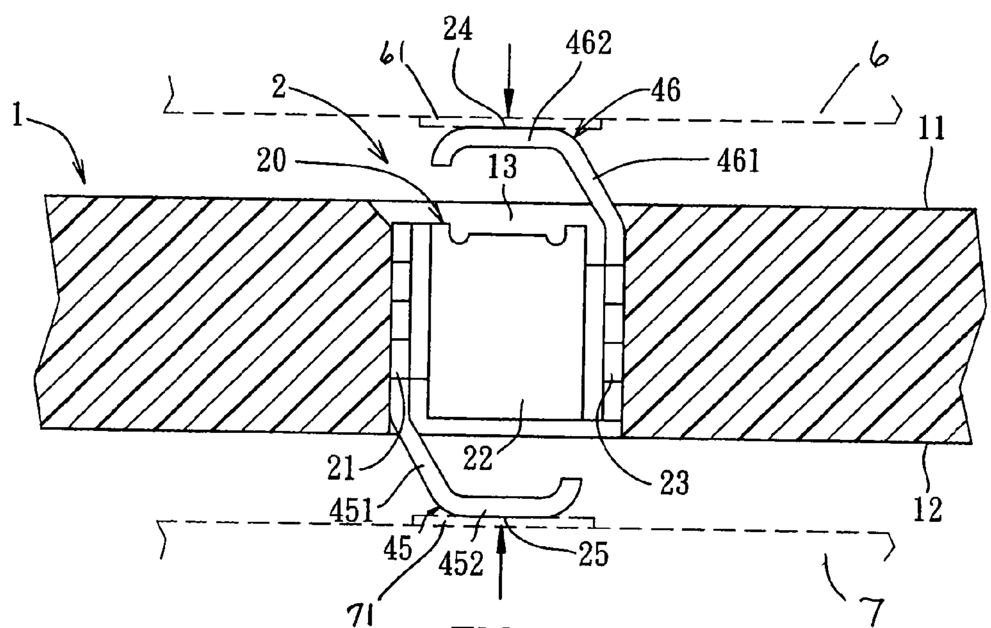
FIG. 3 is a schematic sectional side view of FIG. 2, illustrating the relative position relationship of the conductive terminal in the insulating housing.

Referring to FIGS. 2 and 3, similar to the aforesaid conventional structure, the first illustrated embodiment of a conductive terminal and an electrical connector applying the conductive terminal according to this invention is used to connect an electronic component of an integrated circuit of a central processing unit (CPU) with a circuit board. A bottom side of the electronic component 6 has a plurality of contact pads 61 arranged thereon in an array, whereas a surface of the circuit board 7 is provided with a plurality of conductive contact pads 71 at positions corresponding to the contact pads 61. The electrical connector includes an insulative housing 1 and a plurality of conductive terminals 2.

The insulative housing 1 is formed with a first face 11 disposed at an upper side to be proximate to the electronic component, and a second face 12 disposed at a lower side to be proximate to the circuit board, and has a plurality of terminal receiving cavities 13 extending through the first face 11 and the second face 12. The position of each of the terminal receiving cavities 13 corresponds to the contact pads of the electronic component and the circuit board, and the shape of the space in each of the terminal receiving cavities 13 is defined by an inner wall surface 13*a*. In this embodiment, the terminal receiving cavity 13 is formed as a rectangular cavity.

Each of the conductive terminals 2 includes a base 20, and a first contact portion 24 and a second contact portion 25 which extend from the base 20 and which are capable of resilient restoration. In this embodiment, the base 20 is punched and bent from a metal plate into a U-shape, which is formed with a first sidewall 21, a second side wall 22, and a third sidewall 23 that are adjacent and substantially perpendicular relative to one another. The first sidewall 21 and the third sidewall 23 are opposite to each other in a spaced-apart relationship and are located on either side of the second sidewall 22. In actual assembly, the first sidewall 21 and the third sidewall 23 can be slightly stretched outward relative to the second sidewall 22. After the base 20 is inserted into the corresponding terminal receiving cavity 13, the first sidewall 21 and the third sidewall 23 press against the inner wall surface defining the terminal receiving cavity 13 such that a resilient restoring force is generated at the first sidewall 21 and the third sidewall 23 so as to enable the base 20 to engage with the inner wall surface, thereby positioning each conductive terminal 2 in the corresponding terminal receiving cavity 13.

Further, each of the first sidewall 21, the second sidewall 22 and the third sidewall 23 of the base 20 of the conductive terminal 2 is formed with a first edge (21*a,* 22*a,* 23*a,* respectively) proximate to the first face 11 of the insulative housing 1, and a second edge (21*b,* 22*b,* 23*b,* respectively) proximate to the second face 12 of the insulative housing 1 in the direction of extension of the terminal receiving cavity 13. A first resilient arm 45 extends from the first sidewall 21, and a second resilient arm 46 extends from the third sidewall 23. The first resilient arm 45 has a first slanting section 451 extending outwardly and slantingly from the second edge of the first sidewall 21 proximate to the second face 12 of the insulative housing 1 in the direction of the third sidewall 21, and a first horizontal section 452 connected to the other end of the first slanting section 451 to be exposed from the second face 12. The first horizontal section 452 is a free end capable of resilient restoration. The second resilient arm 46 has a second slanting section 461 extending outwardly and slantingly from the first edge of the third sidewall 23 proximate to the first face 11 of the insulative housing 1 in the direction of the first sidewall 21, and a second horizontal section 462 connected to the other end of the second slanting section 461 to be exposed outwardly of the first face 11. The second horizontal section 462 is also a free end capable of resilient restoration. The first contact portion 24 is located on the second horizontal section 462 to contact the electronic component, whereas the second contact portion 25 is located on the first horizontal section 452 to contact the circuit board.

When the electrical connector is interposed between the electronic component and the circuit board such that they are proximate to each other, the first contact portion 24 of the conductive terminal 2 electrically contacts the contact pad of the electronic component, and the second contact portion 25 electrically contacts the contact pad of the circuit board such the first resilient arm 45 and the second resilient arm 46 can be compressed to generate a resilient restoring force, thereby strengthening the electrical contact characteristics of the first contact portion 24 and the second contact portion 25.

Figure 4:
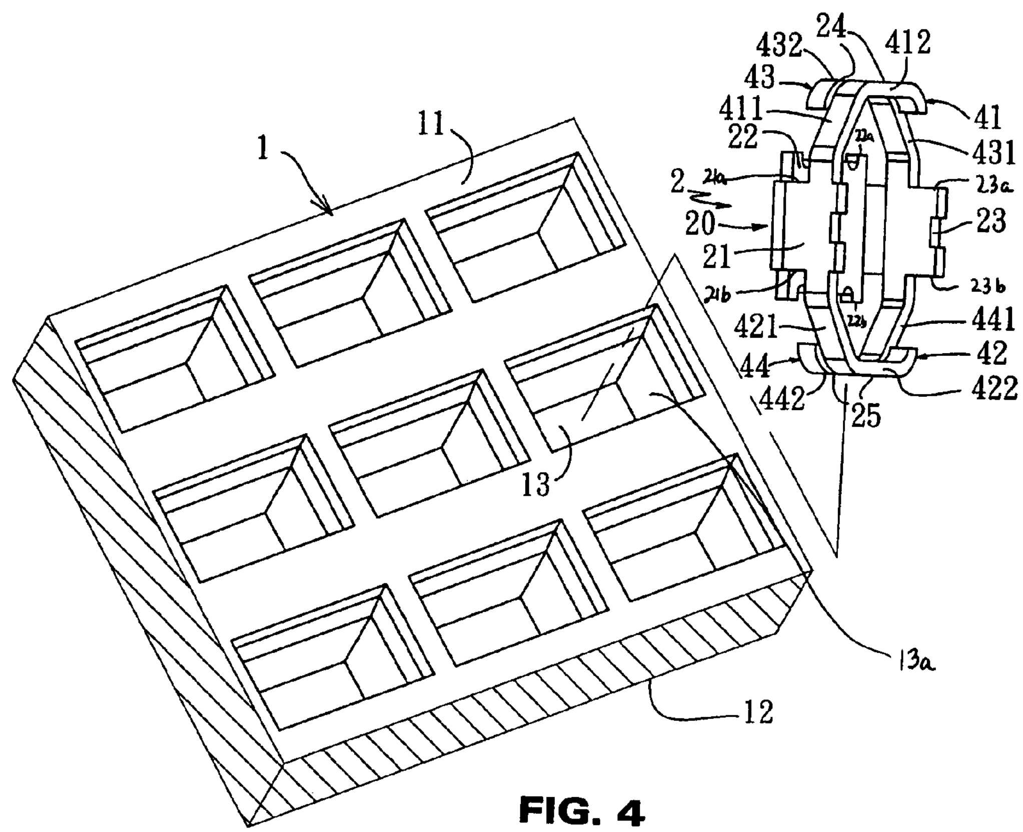
FIG. 4 is a perspective view of the structure of an alternate embodiment of a conductive terminal according to this invention, illustrating schematically the configuration of an electrical connector formed by an assembly of the conductive terminal and an insulative housing.
Figure 5:
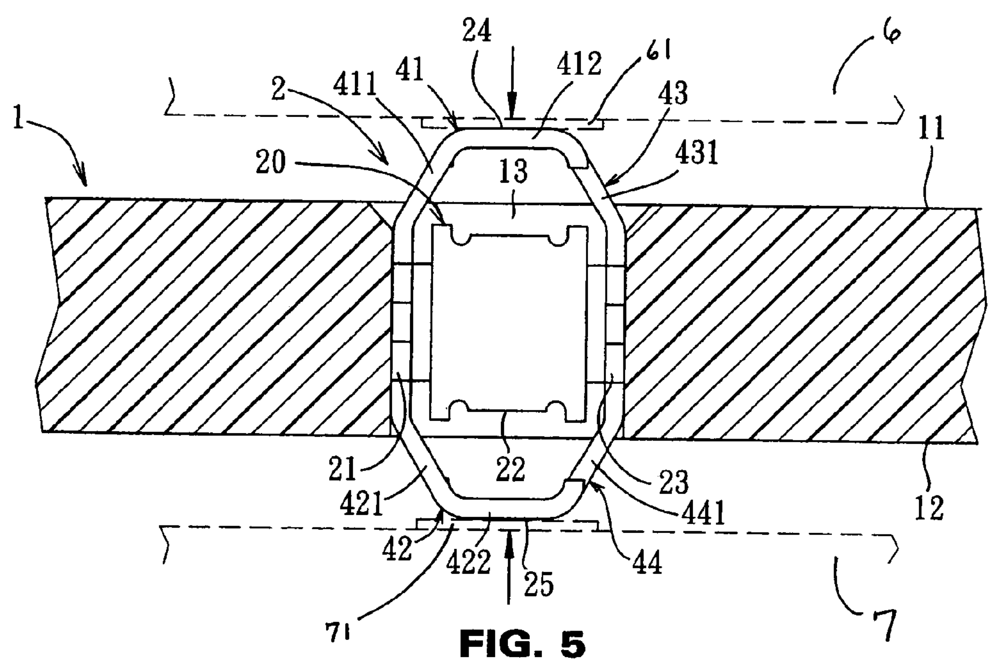
FIG. 5 is a schematic sectional side view of FIG. 4, illustrating the relative position relationship of the conductive terminal in the insulating housing.

Referring to FIGS. 4 and 5, each of the conductive terminals 2 includes a base 20, and a first contact portion 24 and a second contact portion 25 which extend from the base 20 and which are capable of resilient restoration. A first resilient arm 41 and a second resilient arm 42 extend from the first sidewall 21. A third resilient arm 43 and a fourth resilient arm 44 extend from the third sidewall 23. In this embodiment, the first resilient arm 41 extends from the first edge of the first sidewall 21 proximate to the first face 11 of the insulative housing 1 to project outwardly of the first face 11, and includes a first slanting section 411 and a first horizontal section 412 that are interconnected. The second resilient arm 42 extends from the second edge of the first sidewall 21 proximate to the second face 12 of the insulative housing 1 to project outwardly of the second face 12, and includes a second slanting section 421 and a second horizontal section 422 that are interconnected. The first horizontal section 412 and the second horizontal section 422 are free ends capable of resilient restoration. Similarly, the third resilient arm 43 extends from the first edge of the third sidewall 23 proximate to the first face 11 of the insulative housing 1 to project outwardly of the first face 11, and includes a third slanting section 431 and a third horizontal section 432 that are interconnected. The fourth resilient arm 44 extends from the second edge of the third sidewall 23 proximate to the second face 12 of the insulative housing 1 to project outwardly of the second face 12, and includes a fourth slanting section 441 and a fourth horizontal section 442 that are interconnected. The third horizontal section 432 and the fourth horizontal section 442 are also free ends capable of resilient restoration.

In use, the first contact portion 24 is located on both the first horizontal section 412 of the first resilient arm 41 and the third horizontal section 432 of the third resilient arm 43, whereas the second contact portion 25 is located on both the second horizontal section 422 of the second resilient arm 42 and the fourth horizontal section 442 of the fourth resilient arm 44. When the electrical connector is interposed between the electronic component and the circuit board such that they are proximate to each other, the first contact portion 24 of the conductive terminal 2 electrically contacts the contact pad of the electronic component, while the second contact portion 25 electrically contacts the contact pad of the circuit board such that the first resilient arm 41 and the third resilient arm 43, and the second resilient arm 42 and the fourth resilient arm 44 can be compressed to produce a resilient restoring force so as to enhance the electrical contact characteristics of the first contact portion 24 and the second contact portion 25.

In addition, when the first contact portion 24 and the second contact portion 25 electrically contact the electronic component and the circuit board, respectively, there are two signal transmission paths. One is through the path formed by the first resilient arm 41, the first sidewall 21 and the second resilient arm 42. The other is through the path formed by the third resilient arm 43, the third sidewall 23 and the fourth resilient arm 44. Therefore, a dual conducting path is achieved to thereby effectively lower the value of inductance between the first contact portion 24 and the second contact portion 25, which has the effect of enhancing reliability in terms of high-frequency signal transmission.

Figure 6:
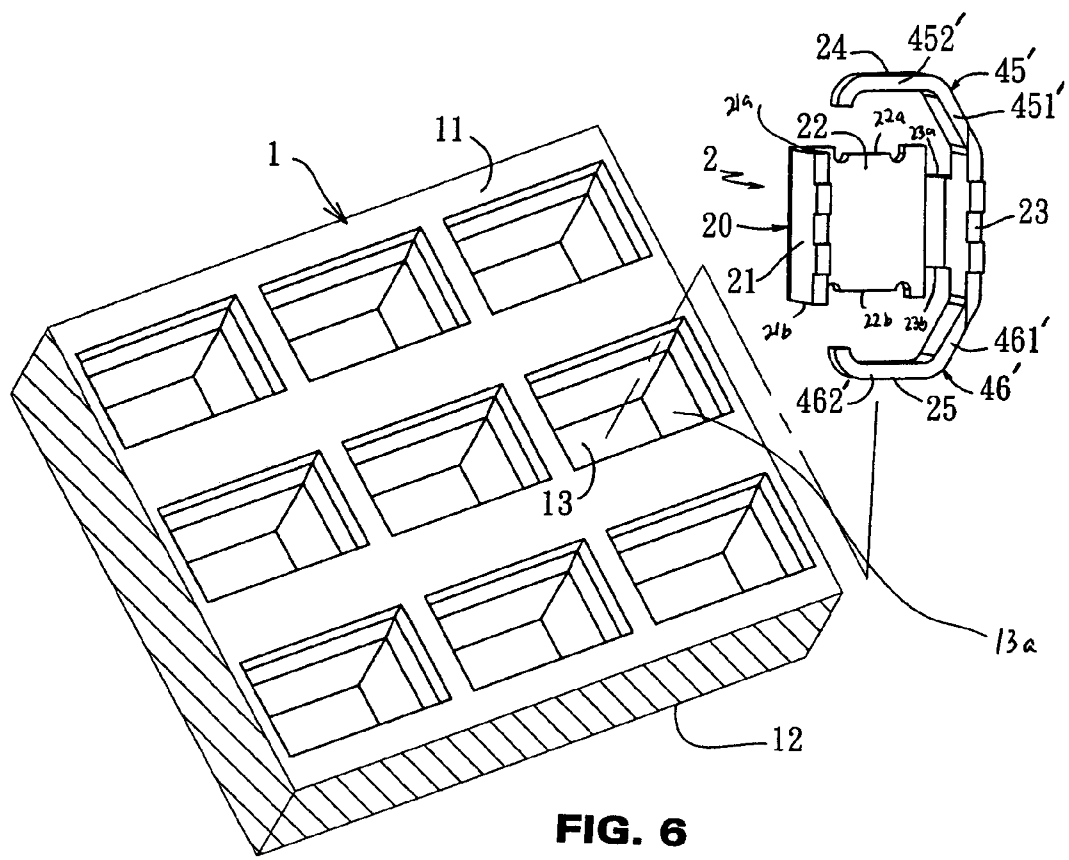
FIG. 6 is a perspective view of the structure of another embodiment of a conductive terminal according to this invention, illustrating schematically the configuration of an electrical connector formed by an assembly of the conductive terminal and an insulative housing.
Figure 7:
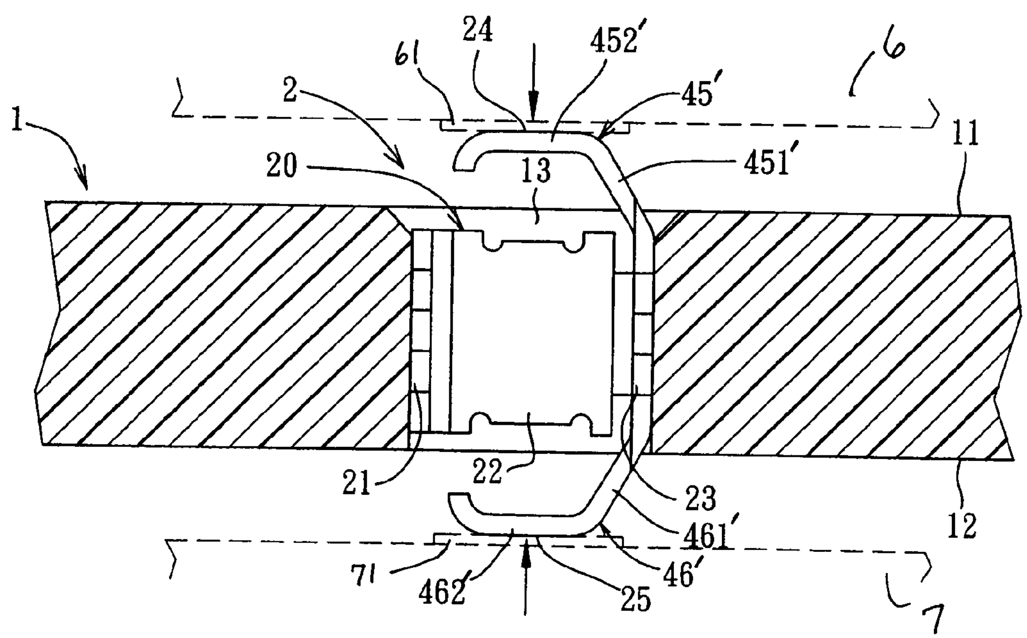
FIG. 7 is a schematic sectional side view of FIG. 6, illustrating the relative position relationship of the conductive terminal in the insulating housing.

Referring to FIGS. 6 and 7, each of the conductive terminals 2 includes a base 20, and a first contact portion 24 and a second contact portion 25 which extend from the base 20 and which are capable of resilient restoration. A first resilient arm 45' and a second resilient arm 46' extend respectively from the third sidewall 23. The first resilient arm 45' has a first slanting section 451' extending slantingly from the first edge of the third sidewall 23 proximate to the first face 11 of the insulative housing 1 in the direction of the first sidewall 21, and a first horizontal section 452' connected to the other end of the first slanting section 451 to be exposed from the first face 11. The first horizontal section 452' is a free end capable of resilient restoration. The second resilient arm 46' has a second slanting section 461' extending slantingly from the second edge of the third sidewall 23 proximate to the second face 12 of the insulative housing 1 in the direction of the first sidewall 21, and a second horizontal section 462' connected to the other end of the second slanting section 461' to be exposed outwardly of the second face 12. The second horizontal section 462' may also be a free end capable of resilient restoration. The first contact portion 24 is located on the first horizontal section 452' to contact the electronic component, whereas the second contact portion 25 is located on the second horizontal section 462' to contact the circuit board.

When the electrical connector is interposed between the electronic component and the circuit board such that they are proximate to each other, the first contact portion 24 of the conductive terminal 2 electrically contacts the contact pad of the electronic component, and the second contact portion 25 electrically contacts the contact pad of the circuit board such the resilient arms 45' and 46' can be compressed to generate a resilient restoring force, thereby enhancing the electrical contact characteristics of the first contact portion 24 and the second contact portion 25.

However, the foregoing is merely a description of the preferred embodiment of this invention, in which although the base is illustrated as having a U-shape, the use of two spaced-apart opposite sidewalls (e.g., a base with sidewalls adjacent to each other in an H-shape) can match the arrangement of the first resilient arm and the second resilient arm. In addition, the bent shape of the first resilient arm and the second resilient arm can also be in a form different from the aforesaid and can be further modified. Therefore, the foregoing should not be based upon to limit the scope of this invention in practice. That is, any simple equivalent changes or modifications made within the scope of the claims and the specification of the invention should be deemed to fall within the scope covered by a patent to this invention.

What is claimed is:

1. A conductive terminal, which is positioned in an insulative housing to be electrically connected to an electronic component and a circuit board, the insulative housing being formed with a first face and a second face which are opposite to each other, and having a plurality of terminal receiving cavities extending through the first face and the second face, each conductive terminal comprising:

a base for abutting against the corresponding terminal receiving cavity to achieve positioning, the base having two spaced-apart opposite sidewalls, each of the sidewalls having a first edge and a second edge which are opposite to each other in a direction of extension of the terminal receiving cavity, a first resilient arm extending outwardly from the edge of one of the sidewalls in a direction away from the sidewall, a second resilient arm extending outwardly from the edge of one of the sidewalls in a direction away from the sidewall such that the first resilient arm forms a second contact portion at a free end and the second resilient arm forms a first contact portion at a free end;

the first contact portion projecting outwardly of a plane in which the first face of the insulative housing lies, the second contact portion projecting outwardly of a plane in which the second face of the insulative housing lies, the first contact portion and the second contact portion contacting respectively and electrically the electronic component and the circuit board to enable signal transmission between the electronic component and the circuit board through the conductive terminal.

2. The conductive terminal as recited in claim 1, wherein the first resilient arm extends from the second edge of one of the side walls and the second resilient arm extends from a first edge of one of the side walls.

3. The conductive terminal as recited in claim 1, wherein the first resilient arm extends from the second edge of one of the side walls and the second resilient arm extends from a first edge of the other side wall.

4. The conductive terminal as recited in claim 1, including a third resilient arm extending from the edge of one of the side walls and a fourth resilient arm extending from the edge of one of the side walls.

5. The conductive terminal as recited in claim 4, wherein the first resilient arm extends from the second edge of one of the side walls, the second resilient arm extends from the second edge of the other side wall, the third resilient arm extends from the first edge of one of the side walls and the fourth resilient arm extends from the first edge of the other side wall.

6. The conductive terminal as recited in claim 1, wherein the first resilient arm has an outwardly and obliquely extending first slanting section connected to the second edge of said one of the sidewalls, and a first horizontal section connected to the other end of the first slanting section, and the second resilient arm has an outwardly and obliquely extending second slanting section connected to the first edge of said other one of the sidewalls, and a second horizontal section connected to the other end of the second slanting section such that the first contact portion is located on the second horizontal section and the second contact portion is located on the first horizontal section.

7. The conductive terminal as recited in claim 2, wherein the base is formed with a first sidewall, a second sidewall, and a third sidewall, which form angles thereamong and which are adjacent to one another in a U-shape, the first sidewall and the third sidewall being opposite to each other in a spaced-apart relationship, the first slanting section of the first resilient arm extending outwardly from the second edge of the first sidewall, the second slanting section of the second resilient arm extending outwardly from the first edge of the third sidewall.

8. The conductive terminal of claim 1, wherein the first edge and the second edge of one of the sidewalls respectively extending outwardly in opposite directions to form a first resilient arm and a second resilient arm, the first edge and the second edge of the other one of the sidewalls respectively extending outwardly in opposite directions to form a third resilient arm and a fourth resilient arm such that the first resilient arm and the third resilient arm cooperatively form a first contact portion, the second resilient arm and the fourth resilient arm cooperatively form a second contact portion.

9. The conductive terminal as recited in claim 8, wherein the first resilient arm has a first slanting section extending outwardly and slantingly from the first edge of the sidewall of the base, and a first horizontal section connected to the other end of the first slanting section, the second resilient arm symmetrically having a second slanting section extending outwardly and slantingly from the second edge of the sidewall of the base, and a second horizontal section connected to the other end of the second slanting section such that the first contact portion is partly located on the first horizontal section and the second contact portion is partly located on the second horizontal section.

10. The conductive terminal as recited in claim 8, wherein the third resilient arm has a third slanting section extending outwardly and slantingly from the first edge of the sidewall of the base, and a third horizontal section connected to the other end of the third slanting section, the fourth resilient arm symmetrically having a fourth slanting section extending outwardly and slantingly from the second edge of the sidewall of the base, and a fourth horizontal section connected to the other end of the fourth slanting section such that the first contact portion is partly located on the third horizontal section and the second contact portion is partly located on the fourth horizontal section.

11. The conductive terminal as recited in claim 8, wherein the base is formed with a first sidewall, a second sidewall, and a third sidewall, which are adjacent to one another in a U-shape and which form angles thereamong, the first sidewall and the third sidewall being opposite to each other in a spaced-apart relationship, the first slanting section and the second slanting section extending slantingly from the first edge and the second edge of the first sidewall toward the third sidewall.

12. The conductive terminal as recited in claim 8, wherein the base is formed with a first sidewall, a second sidewall, and a third sidewall, which are adjacent to one another in a U-shape and form angles thereamong, the first sidewall and the third sidewall being opposite to each other in a spaced-apart relationship, the third slanting section and the fourth slanting section extending slantingly from the first edge and the second edge of the third sidewall toward the first sidewall.

13. The conductive terminal as recited in claim 1, wherein the first resilient arm has an outwardly and obliquely extending first slanting section connected to the first edge of the sidewall, and a first horizontal section connected to the other end of the first slanting section, and the second resilient arm has an outwardly and obliquely extending second slanting section connected to the second edge of the sidewall, and a second horizontal section connected to the other end of the second slanting section such that the first contact portion is located on the first horizontal section and the second contact portion is located on the second horizontal section.

14. The conductive terminal as recited in claim 13, wherein the base is formed with a first sidewall, a second sidewall, and a third sidewall, which are adjacent in a U-shape and which form angles thereamong, the first sidewall and the third sidewall being opposite to each other in a spaced-apart relationship, the first slanting section of the first resilient arm extending outwardly from the first edge of the third sidewall, the second slanting section extending outwardly from the second edge of the third sidewall.

15. An electrical connector adapted to provide electrical connection between an electronic component and a circuit board, the electrical connector comprising:

an insulative housing formed with a first face and a second face which are opposite to each other, and having a plurality of terminal receiving cavities extending through the first face and the second face, each of the terminal receiving cavities being defined by a corresponding inner wall surface; and a plurality of conductive terminals disposed in the corresponding terminal receiving cavities, each of the conductive terminals including:

a base having two spaced-apart opposite sidewalls, each of the sidewalls formed with a first edge proximate to the first face of the insulative housing and a second edge proximate to the second face of the insulative housing in a direction of extension of the terminal receiving cavity, the base abutting against the inner wall surface of the corresponding terminal receiving cavity to achieve positioning;

a first resilient arm extending from the edge of one of the sidewalls of the base in a direction away from the sidewall and forming, at a free end, a second contact portion which is capable of resilient restoration and which projects outwardly of a plane in which the second face lies;

a second resilient arm extending from the edge of one of the sidewalls in a direction away from said other one of the sidewalls and forming, at a free end, a first contact portion which is capable of resilient restoration and which projects outwardly of the first face;

the first contact portion and the second contact portion electrically contacting the electronic component and the circuit board, respectively, to enable signal transmission between the electronic component and the circuit board through the conductive terminals.

16. The electrical connector as recited in claim 15, wherein the first resilient arm of the conductive terminal has a first slanting section connected to said one of the sidewalls and a first horizontal section connected to the other end of the first slanting section, and the second resilient arm has a second slanting section connected to said other one of the sidewalls and a second horizontal section connected to the other end of the second slanting section such that the first contact portion is located on the second horizontal section and the second contact portion is located on the first horizontal section.

17. The electrical connector as recited in claim 15, wherein the base of the conductive terminal is formed with a first sidewall, a second sidewall, and a third sidewall, which form angles thereamong and which are adjacent to one another in a U-shape, the first sidewall and the third sidewall being opposite to each other in a spaced-apart relationship, the first resilient arm extending outwardly from the first sidewall, the second resilient arm extending outwardly from the third sidewall.

18. An electrical connector adapted to provide electrical connection between an electronic component and a circuit board, the electrical connector comprising:

an insulative housing formed with a first face and a second face which are opposite to each other, and having a plurality of terminal receiving cavities extending through the first face and the second face, each of the terminal receiving cavities being defined by a corresponding inner wall surface; and a plurality of conductive terminals disposed in the corresponding terminal receiving cavities, each of the conductive terminals including a base having two spaced-apart opposite sidewalls, the base portion abutting against the inner wall surface of the corresponding terminal receiving cavity to achieve positioning, and a first resilient arm and a second resilient arm, and a third resilient arm and a fourth resilient arm extending respectively in pairs from the base;

the base having two spaced-apart opposite sidewalls, each of the sidewalls being formed with a first edge and a second edge opposite to each other in a direction of extension of the respective terminal receiving cavity;

the first resilient arm and the second resilient arm extending respectively and outwardly from the first edge and the second edge of one of the sidewalls of the base such that the first resilient arm projects outwardly of a plane in which the first face of the insulative housing lies and the second resilient arm projects outwardly of a plane in which the second face of the insulative housing lies;

the third resilient arm and the fourth resilient arm extending respectively and outwardly from the first edge and the second edge of the other one of the sidewalls of the base such that the third resilient arm projects outwardly of a plane in which the first face of the insulative housing lies and the fourth resilient arm projects outwardly of a plane in which the second face of the insulative housing lies;

the first resilient arm and the third resilient arm cooperatively forming a first contact portion, the second resilient arm and the fourth resilient arm cooperatively forming a second contact portion, the first contact portion and the second contact portion respectively and electrically contacting the electronic component and the circuit board to form a dual conducting path, thereby enabling signal transmission between the electronic component and the circuit board through the conductive terminals.

19. The electrical connector as recited in claim 18, wherein the first resilient arm of the conductive terminal has a first slanting section extending slantingly from the first edge of the sidewall of the base, and a first horizontal section connected to the other end of the first slanting section, the second resilient arm symmetrically having a second slanting section extending slantingly from the second edge of the sidewall of the base, and a second horizontal section connected to the other end of the second slanting section such that the first contact portion is partly located on the first horizontal section and the second contact portion is partly located on the second horizontal section.

20. The electrical connector as recited in claim 18, wherein the third resilient arm of the conductive terminal has a third slanting section extending from the first edge of the sidewall of the base, and a third horizontal section connected to the other end of the third slanting section, the fourth resilient arm symmetrically having a fourth slanting section extending from the second edge of the sidewall of the base, and a fourth horizontal section connected to the other end of the fourth slanting section such that the first contact portion is partly located on the third horizontal section and the second contact portion is partly located on the fourth horizontal section.

* * * * *